United States Patent [19]

Kitora et al.

[11] Patent Number: 4,897,566

[45] Date of Patent: Jan. 30, 1990

[54] BIPOLAR TRANSISTOR LOGIC CIRCUIT

[75] Inventors: Takatsugu Kitora; Youichirou Taki, both of Itami, Japan

[73] Assignee: Mitsubishi Denki Kabushiki Kaisha, Tokyo, Japan

[21] Appl. No.: 115,725

[22] Filed: Nov. 2, 1987

[30] Foreign Application Priority Data

Oct. 31, 1986 [JP] Japan .................................. 61-261210

[51] Int. Cl.$^4$ ........................ H03K 19/20; H03K 3/33; H03K 3/01; H03K 17/16
[52] U.S. Cl. .................................... 307/456; 307/458; 307/300; 307/270; 307/443
[58] Field of Search ............... 307/456, 457, 458, 270, 307/300, 280, 263, 315, 443, 454

[56] References Cited

U.S. PATENT DOCUMENTS

| | | |
|---|---|---|
| 4,321,490 | 3/1982 | Bechdolt .............................. 307/456 |
| 4,449,063 | 5/1984 | Ohmichi et al. ..................... 307/280 |
| 4,486,674 | 12/1984 | Neely ................................... 307/456 |
| 4,521,699 | 6/1985 | Wilson ................................. 307/456 |
| 4,535,258 | 8/1985 | Tanizawa ............................. 307/270 |
| 4,704,548 | 11/1987 | Strong et al. ........................ 307/270 |
| 4,740,719 | 4/1988 | Taki ..................................... 307/270 |

Primary Examiner—John S. Heyman
Assistant Examiner—Trong Quang Phan
Attorney, Agent, or Firm—Sughrue, Mion, Zinn, Macpeak & Seas

[57] ABSTRACT

A bipolar transistor logic circuit, combinable with a printed circuit board without ringing, crosstalk, or oscillation in operation. Change in potential at an output mode of the logic circuit through discharge of capacitance at that node is delayed with respect to change in level of an input signal by connecting accelerated discharge circuitry among a first potential node, the output node, and an input transistor which receives the input signal.

1 Claim, 3 Drawing Sheets (a) INPUT SIGNAL (b) OUTPUT NODE (a) INPUT SIGNAL (b) OUTPUT NODE DISCLOSED FIG.3

(c) OUTPUT NODE DISCLOSED FIG.1

BIPOLAR TRANSISTOR LOGIC CIRCUIT

BACKGROUND OF THE INVENTION

This invention relates to a bipolar transistor logic circuit and more particularly to an ALSTTL (Advanced Low-power Schottky Transistor - Transistor Logic) output circuit.

FIG. 1 shows a conventional ALSTTL output circuit. In FIG. 1, a first npn type Schottky barrier bipolar transistor 4 receives an input signal at its base. The first transistor 4 becomes conductive when the input signal is a signal designating output of a low level logic signal on an output node 3. The transistor 4 is non-conductive when the input signal is a signal designating output of a high level logic signal on the output node 3. The collector of the first transistor 4 is connected to a first node 1, which may be at 5V, for example, through a first load element 10, which may be a resistor.

An npn type Schottky barrier bipolar transistor 6 and an npn type bipolar transistor 7 are Darlington-connected. The base of the transistor 6 is connected to the collector of the first transistor 4 and the collector of the transistor 6 is connected to the collector of the transistor 7. The emitter of the transistor 6 is connected to the base of the transistor 7. The collector of the transistor 7 is connected to the first potential node 1 through a second load element 8, which may be a resistor.

The base of an npn type Schottky barrier bipolar transistor 5 is connected to the emitter of the first transistor 4 and the collector of the transistor 5 is connected to the output node 3. The emitter of the transistor 5 is connected to a second node 2, which may be ground, for example.

The anode of a Schottky barrier diode (SBD) 9 is connected to the output node 3 and the cathode of the SBD 9 is connected to the collector of the first transistor 4. The SBD 9 discharges charge stored in a charge storage device (such as a capacitor) connected to the output node 3 such that current can flow to the base of the transistor 5 through the transistor 4 when the potential of the output node 3 changes from "high" to "low".

In discussing the operation of the above output circuit, let it be assumed that a low-level input signal is supplied to the base of the first transistor 4. At this time, the first transistor 4 is non-conductive, and so the transistor 5 also is non-conductive. On the other hand, as the potential at the collector of the first transistor 4 is increased through potential applied at the potential node 1, the Darlington-connected transistors 6 and 7 become conductive. Accordingly, current flows to the output node 3 from the first potential node 1 through the second load element 8 and the transistor 7, and the potential of the output node 3 is "high" ($V_{OH}$). At this time, the charge storage device connected to the output node 3 stores a charge.

Next, assume the input signal changes to a "high" level from a "low" level. The first transistor 4 then becomes conductive, and the collector current flows, limited by the first load element 10. At this time, a part of the charge stored in the charge storage device flows to the base of the transistor 5 as the part of the abovementioned collector current through the SBD 9 and the first transistor 4. As a result, current flows to the collector of the transistor 5 in accordance with the current amplification rate of the transistor 5. The charge stored on the output node 3 is discharged rapidly through the transistor 5, and the potential of the output node 3 decreases promptly.

After that, as the transistor 5 becomes conductive and draws out the current from the output node 3, the potential of the output node 3 becomes "low". On the other hand, as the potential at the collector of the first transistor 4 decreases, the abovementioned Darlington-connected transistors 6, 7 become non-conductive.

The first transistor 4 is conductive when the potential of the input signal at its base is higher than the sum of the base-emitter voltage $V_{BE5}$ of the transistor 5 and base-emitter voltage $V_{BE4}$ of the first transistor 4 based on the potential at the second potential node 2. The first transistor 4 is non-conductive otherwise. The relationship between the potential of the output node 3 and the input signal is shown in FIG. 2.

In the above output circuit, as the charge stored in the charge storage device connected to the output node 3 is rapidly discharged to provide an immediate change to a "low" level when the potential of the output node 3 changes to a "low" level from a "high" level, the output state at the output node 3 changes suddenly when the charge storage device connected to the output node 3 is smaller, as shown in the dotted line of the waveform (b) of FIG. 2.

When the capacitance of the charge storage device is 10pf, the time $t_f$, when the charge is discharged to 10% from 90% of the original charge, is 2.0 ns. Such an immediate change of the output node 3 causes crosstalk, ringing, or oscillation. As a result, the above described output circuit cannot be provided easily with another circuit such as a printed wiring board, on the same substrate.

The reason for the above-mentioned difficulty is as follows. If it is assumed that this kind of output circuit is combined with a printed circuit board, the capacitance on the output node of output circuit is about 10 pf and the objective value of the above time $t_f$, which is not influenced by crosstalk, etc., must be more than 2.2 ns. If $t_f$ is smaller than 2.2 ns, it is easy for crosstalk, etc. to occur because of parasitic capacitance or inductance between signal lines on the printed circuit board. Accordingly, the above output circuit, with $t_f$ being 2.0 ns, could not be combined with the printed circuit board.

The kind of output circuit just described is disclosed in *MITSUBISHI SEMICONDUCTORS DATABOOK: BIPOLAR DIGITAL IC ALSTTL*, 1985, p. 2-90. This output circuit also has a switching transistor connected between the collector of the first transistor 4 and the cathode of the SBD 9 in the output circuit as shown in FIG. 1. This circuit has the same problem as the output circuit shown in FIG. 1.

SUMMARY OF THE INVENTION

With the foregoing deficiencies in mind, it is an object of the present invention to provide a bipolar transistor logic circuit which prevents an immediate change from a high level to a low level at the output node, and thus delays that change, even though the capacitance connected to the output node may be smaller.

In order to accomplish this and other objects, the disclosed inventive bipolar transistor logic circuit includes a first transistor circuit receiving an input signal, a second transistor circuit connected between a first potential node and an output node and having its base connected to the collector of the first transistor, and a third transistor circuit connected between a second potential node and the output node and having its base connected to the emitter of the first transistor.

The inventive logic circuit further includes an accelerated discharge means for discharging the charge stored in a charge storage device connected to the output node and to the base of the third transistor circuit through the first transistor circuit at a time delayed slightly after a change by the first transistor to the conductive state from the non-conductive state.

BRIEF DESCRIPTION OF THE DRAWINGS

The present invention now will be described with reference to the accompanying drawings, in which.

DETAILED DESCRIPTION OF THE PREFERRED EMBODIMENT

Figure 1:
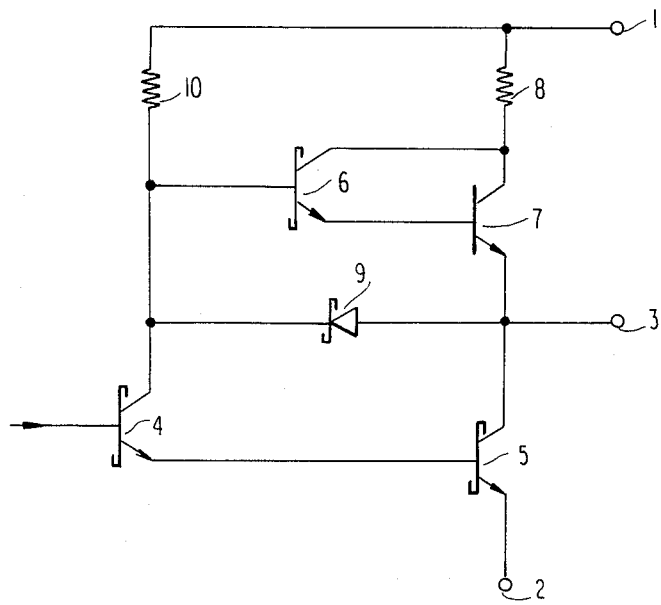
FIG. 1 is a circuit diagram of a conventional ALSTTL output circuit.
Figure 2:
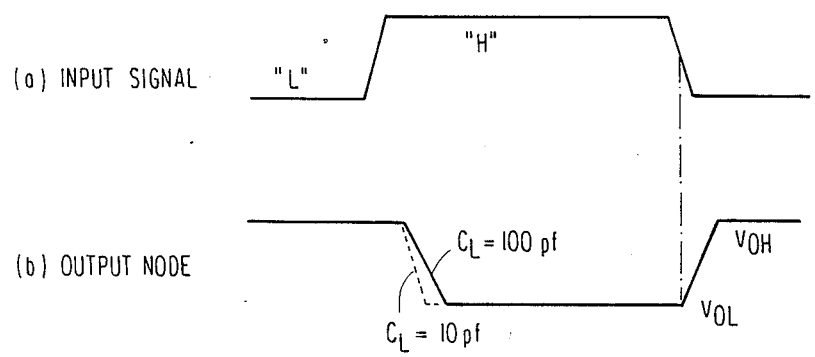
FIG. 2 depicts waveforms of the output circuit of FIG. 1.
Figure 3:
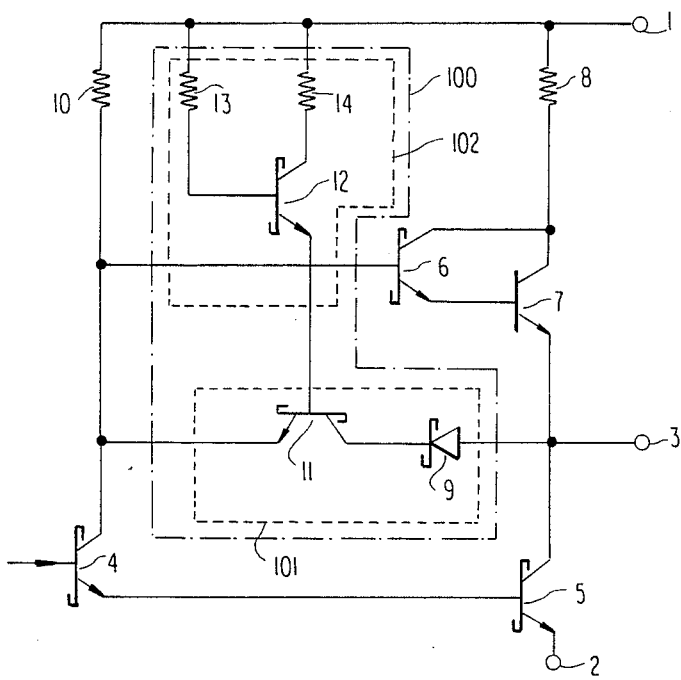
FIG. 3 is a circuit diagram of a bipolar transistor logic circuit in accordance with the present invention.

In describing the logic circuit according to the invention as shown in FIG. 3, corresponding circuit elements will be numbered similarly to the numbering used in FIG. 1. The following description will be focussed on the differences between the two circuits, and several particular features will be described in detail.

An accelerated discharge means 100 is provided in the circuit of FIG. 3 for discharging the charge stored in a capacitance connected to output node 3, causing current flow to the base of the transistor 5 through the first transistor 4 at a time which is delayed slightly after the transistor 4 becomes conductive. The accelerated discharge means 100 includes a switching means 101 and a switching delay means 102. The switching means 101 has an npn type Schottky barrier bipolar transistor 11 and an SBD 9. The emitter of the transistor 11 is connected to the collector of the transistor 4. The SBD 9 has its anode connected to the output node 3 and its cathode connected to the collector of the transistor 4.

The switching delay means 102 makes the switching means 101 conductive at a time that is slightly delayed from the time when the transistor 4 becomes conductive. The switching delay means includes an npn type Schottky barrier bipolar transistor 12, and load elements (resistors) 13 and 14. The transistor 12 has its emitter connected to the base of the transistor 11, its collector connected to the first potential node 1 through the load element 14, and its base connected to the first potential node 1 through the load element 13.

The load element 13 controls the timing when the transistor 12 becomes conductive. The load element 14 limits the current flowing to the base of the transistor 11 through the transistor 12 and increases the discharging capacity of the transistor 11. The SBD 9 cuts off the current path from the first potential node 1 to the output node 3 through the transistors 12 and 11.

In the operation of the logic circuit of FIG. 3, let it be assumed that the input signal supplied to the base of the first transistor 4 is "low" so that the first transistor 4 is non-conductive. As a result, the transistor 5 also is non-conductive. On the other hand, as the potential at the collector of the transistor 4 is increased through potential applied at the first potential node 1, the Darlington-connected transistors 6 and 7 are conductive, and the transistors 11 and 12 and the SBD 9 are non-conductive. Accordingly the current flows to the output node 3 from the first potential node 1 through the load element 8 and the transistor 7, and the potential of the output node 3 is at a "high" level $V_{OH}$. At this time, the charge storage device connected to the output node 3 stores charge.

Figure 4:
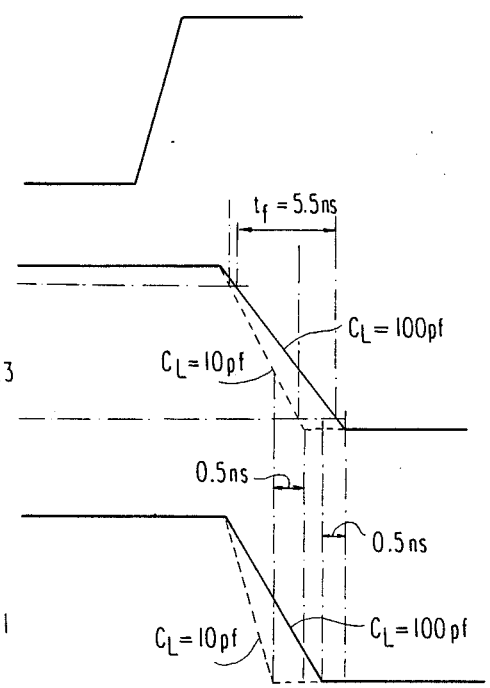
FIG. 4 depicts waveforms in the logic circuit of FIG. 3.

Next, when the input signal at the base of the transistor 4 becomes high, as shown by waveform (a) of FIG. 4, the transistor 4 becomes conductive and the collector current flows, limited by the load element 10. As a result, the collector potential of the first transistor 4 decreases, as shown in waveform (c) of FIG. 4. Then, the potential difference between the emitter of the transistor 11 and the base of the transistor 12 becomes larger than the threshold voltage of both transistors 11 and 12, $2V_{BE}$, for example, and the transistor 12 becomes conductive.

Current, limited by the load element 14, flows to the base of the transistor 11 from the first potential node 1 through the transistor 14 and the transistor 12. In short, the resistor 13 controls the transition of the transistor 12 to a conductive state and delays that change slightly after the transistor 4 becomes conductive. Then, the transistor 11 becomes a conductive state by receiving current at its base. Accordingly, a part of the charge stored at the output node 3 flows to the base of the transistor 5 through the SBD 9, the transistor 11 and the first transistor 4 shortly after the first transistor 4 becomes conductive.

As a result, current flows to the collector of the transistor 5 in accordance with its current amplification rate. The charge stored at the output node 3 is discharged rapidly through the transistor 5, and the potential of the output node 3 also decreases rapidly. After that, as the transistor 5 becomes conductive and draws out the current from the output node 3, the potential of the output node 3 becomes "low", as shown by waveform (b) in FIG. 4. On the other hand, as the potential at the collector of the first transistor 4 decreases, the Darlington-connected transistors 6 and 7 becomes non-conductive.

In the above logic circuit in accordance with the invention, the transistor 12 becomes conductive when the first transistor 4 becomes conductive, and then the transistor 11 becomes conductive by receiving at its base the current limited by the load element 14. Accordingly, the transistor 11 becomes conductive slightly later than does first transistor 4 in response to the change in the input signal to a "high" level from a "low" level.

Figure 5:
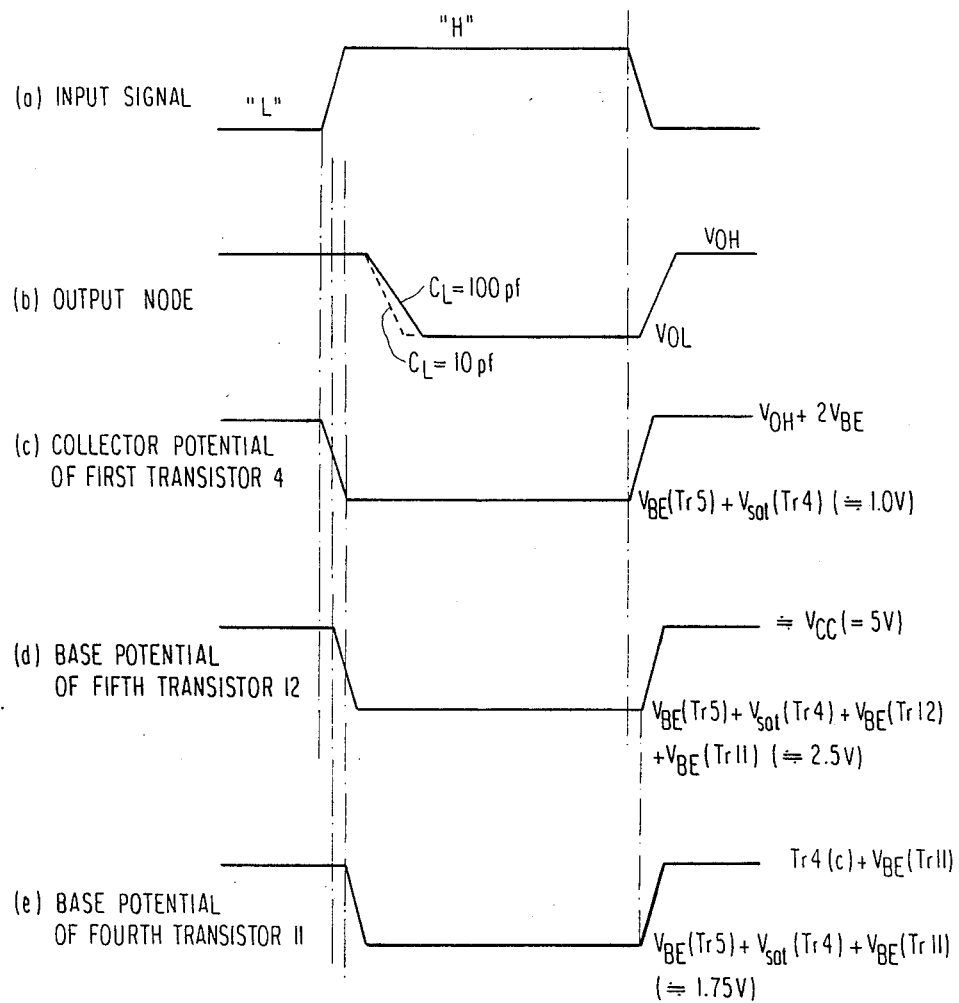
FIG. 5 depicts waveforms relating an input signal with the circuits of FIG. 1 and FIG. 3.

The time $t_f$ when the potential at the output node 3 changes to a "low" level from a "high" level is slightly longer than the corresponding time $t_f$ of the output circuit as shown in FIG. 1, as shown in FIG. 5. For example, when the resistances of the resistors 13 and 14 are respectively 200 kΩ and 40 kΩ and the capacitance at the output node 3 is 10 pf, the time $t_f$ when the potential on the output node 3 changes to a "low" level from a "high" level, is 2.5 ns. Accordingly, in the above logic circuit, when $t_f$ is longer than 2.2 ns, there is no crosstalk, etc. when the circuit is combined with a printed circuit board, based on the immediate change from a "high" level to a "low" level of the output node.

In short, in the above logic circuit in accordance with the invention, as the current which flows to the base of the transistor 11 is controlled by the resistors 13 and 14, the change in potential from "high" to "low" at the output node 3 can take longer, even though the discharge capacitance of the transistor 11 is the same as that of the output circuit shown in FIG. 1.

On the other hand, when the capacitance at the output node 3 is larger, such as 100 pf, the charge stored on the output node 3 is discharged immediately through the transistor 11 controlled by the current limited by the fourth resistor 14, as shown by waveform (b) of FIG. 4. In this case, the time $t_f$ for a change from "high" to "low" level at the output node 3 is 5.5 ns. As shown in FIG. 5, a $t_f$ of 5.5 ns is only 10% longer than the time $t_f$ of the output circuit as shown in FIG. 1 under similar conditions. Accordingly, the logic circuit in accordance with the invention functions similarly to the output circuit shown in FIG. 1.

What is claimed is:

1. A bipolar transistor logic circuit comprising:
   an input node;
   an output node;
   a first potential node connected to a first potential;
   a second potential node connected to a second potential, different from said first potential;
   first transistor circuitry connected to said input node and to said first potential node, wherein said first transistor circuitry comprises a first transistor having its base connected to said input node and a first terminal connected to said first potential node;
   second transistor circuitry provided between said output node and said first potential node, and further connected to said first transistor circuitry, wherein said second transistor circuitry comprises Darlington-connected transistors, a base of one of said Darlington-connected transistors being connected to said first terminal of said first transistor, first terminals of said Darlington-connected transistors being connected to said first potential node, and a second terminal of the other of said Darlington-connected transistors being connected to said output node;
   third transistor circuitry connected between said output node and said second potential node, and further connected to said first transistor circuitry, wherein said third transistor circuitry comprises a second transistor having its base connected to a second terminal of said first transistor, a first terminal of said second transistor being connected to said output node, and a second terminal of said second transistor being connected to said second potential node; and
   accelerated discharge means for discharging charge, stored in a charge storage device that is connected to said output node, to said third transistor circuitry through said first transistor circuitry, said charge being discharged at a time that is delayed with respect to a timing of a change in said first transistor circuitry from a non-conductive state to a conductive state, wherein said accelerated discharge means comprises:
   switching means connected between said output node and said first terminal of said first transistor, wherein said switching means comprises a third transistor and a diode, a first terminal of said third transistor being connected to a cathode of said diode, an anode of said diode being connected to said output node, a second terminal of said third transistor being connected to said first terminal of said first transistor; and
   switching delay means, responsive to a change in said first transistor from a non-conductive state to a conductive state, for delaying a corresponding change in conductivity of said switching means from a non-conductive state to a conductive state with respect to a timing of corresponding change in conductivity of said first transistor, wherein said switching delay means comprises:
   a fourth transistor having a base and first and second terminals, the second terminal of said fourth transistor being connected to a base of said third transistor; and
   first and second load elements each having one end connected to said first potential node, the other end of said second load element being connected to the first terminal of said fourth transistor.

* * * * *